US009384790B2

(12) United States Patent
Trivedi et al.

(10) Patent No.: US 9,384,790 B2
(45) Date of Patent: Jul. 5, 2016

(54) MEMORY DEVICE WITH SEPARATELY CONTROLLED SENSE AMPLIFIERS

(75) Inventors: Manish Trivedi, Ghaziabad (IN); Setti Shanmukheswara Rao, Bangalore (IN); Ankur Goel, Bangalore (IN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 257 days.

(21) Appl. No.: 13/561,673

(22) Filed: Jul. 30, 2012

(65) Prior Publication Data

US 2014/0029366 A1 Jan. 30, 2014

(51) Int. Cl.
| G11C 7/02 | (2006.01) |
| G11C 7/04 | (2006.01) |
| G11C 7/08 | (2006.01) |
| G11C 7/22 | (2006.01) |
| G11C 11/419 | (2006.01) |

(52) U.S. Cl.
CPC .. G11C 7/04 (2013.01); G11C 7/08 (2013.01); G11C 7/227 (2013.01); G11C 11/419 (2013.01)

(58) Field of Classification Search
CPC ........ G11C 7/04; G11C 11/419; G11C 7/227; G11C 7/08
USPC ............. 365/200, 230.06, 210.1, 185.21, 154
See application file for complete search history.

(56) References Cited

U.S. PATENT DOCUMENTS

| 4,931,994 | A | * | 6/1990 | Matsui | .................. | G11C 11/419 327/51 |
| 5,999,482 | A | | 12/1999 | Kornachuk et al. | | |
| 6,088,279 | A | | 7/2000 | Ishii | | |
| 6,201,757 | B1 | | 3/2001 | Ward et al. | | |
| 6,212,117 | B1 | | 4/2001 | Shin et al. | | |
| 6,229,746 | B1 | | 5/2001 | Tooher | | |
| 6,388,931 | B1 | | 5/2002 | Wilkins | | |
| 6,714,472 | B2 | | 3/2004 | Wilkins | | |
| 6,738,296 | B2 | | 5/2004 | Sung et al. | | |
| 6,804,153 | B2 | * | 10/2004 | Yoshizawa et al. | ...... | 365/189.15 |
| 7,593,276 | B2 | * | 9/2009 | Hirabayashi | .............. | G11C 7/08 365/154 |
| 7,746,716 | B2 | | 6/2010 | Jetton et al. | | |
| 2008/0298143 | A1 | | 12/2008 | Chen et al. | | |
| 2009/0116318 | A1 | * | 5/2009 | Kuroda | .................... | G11C 7/08 365/200 |
| 2012/0008438 | A1 | | 1/2012 | Jain et al. | | |

OTHER PUBLICATIONS

B.S. Amrutur et al., "A Replica Technique for Wordline and Sense Control in Low-Power SRAM's," IEEE Journal of Solid-State Circuits, Aug. 1998, pp. 1208-1219, vol. 33, No. 8.
U. Arslan et al., "Variation-Tolerant SRAM Sense-Amplifier Timing Using Configurable Replica Bitlines," IEEE Custom Integrated Circuits Conference (CICC), Nov. 2008, pp. 415-418.
M-F. Chang et al., "Improving the Speed and Power of Compilable SRAM Using Dual-Mode Self-Timed Technique," IEEE International Workshop on Memory Technology, Design and Testing (MTDT), Dec. 2007, pp. 57-60, Taipei, Taiwan.

* cited by examiner

*Primary Examiner* — Tha-O H Bui

(57) ABSTRACT

A memory device includes a memory array comprising memory cells, sense amplifiers configured to sense data stored in the memory cells of the memory array, and control circuitry configured to generate a plurality of separate sense amplifier control signals for application to respective control inputs of respective ones of the sense amplifiers. For example, the memory device may comprise a row of dummy memory cells each coupled to a dummy wordline. In such an arrangement, the control circuitry may comprise a plurality of logic gates coupled to respective ones of the dummy memory cells, with each such logic gate configured to generate a corresponding one of the separate sense amplifier control signals for a corresponding one of the sense amplifiers as a function of a data transition at a bitline of the corresponding dummy memory cell. The separate sense amplifier control signals may comprise respective sense amplifier enable signals.

21 Claims, 5 Drawing Sheets

MEMORY DEVICE WITH SEPARATELY CONTROLLED SENSE AMPLIFIERS

BACKGROUND

A semiconductor memory device typically includes an array of memory cells arranged in rows and columns, with each memory cell configured to store a data bit. The memory cells within a given row of the array are coupled to a common wordline, while the memory cells within a given column of the array are coupled to a common bitline. Thus, the array includes a memory cell at each point where a wordline intersects with a bitline.

In a semiconductor memory device of the type described above, data may be written to or read from the memory cells of the array using a memory cycle that is divided into an active phase and a precharge phase, with the active phase being used to read or write one or more memory cells of the array and the precharge phase being used to precharge the bitlines to a precharge voltage in preparation for the next cycle. Reading a given memory cell generally comprises transferring data stored within that cell to its corresponding bitline, and writing a given memory cell generally comprises transferring data into that cell from its corresponding bitline.

For a given read or write operation, the corresponding memory cycle is more particularly referred to as a read cycle or a write cycle, respectively. In certain types of memory devices, such as static random access memories (SRAMs), the read and write cycle times are not equal. The read access time is typically longer than the write access time, while the write precharge time is longer than the read precharge time.

As is well known to those skilled in the art, read and write self-time tracking arrangements may be used in order to establish appropriate signal timing for respective read and write operations. Such self-time tracking functionality is often designed to control the read and write signal timing over expected process, voltage and temperature (PVT) variations. This is particularly important for high-speed operations having read and write cycle frequencies in the gigahertz (GHz) range.

A conventional self-time tracking arrangement of this type utilizes a dummy row of memory cells and a dummy column of memory cells, associated with a dummy wordline and a dummy bitline, respectively, with those memory cells being configured in substantially the same manner as the actual memory cells of the memory array. A dummy wordline driver generates a dummy wordline signal for application to the dummy wordline with substantially the same timing as an actual wordline signal applied to an actual wordline of the memory array. The dummy wordline and dummy bitline are also known as a self-time wordline (STWL) and a self-time bitline (STBL), respectively.

In order to permit independent control of the read and write cycle times, self-time tracking circuitry may be separated into two paths, one for read and another for write. This approach is also called dual mode self-time (DMST).

Conventional approaches to reading data from a memory cell include the use of differential sense amplifiers. In a typical conventional arrangement, sense amplifiers are associated with respective columns of the memory array. For each read memory cycle, the sense amplifier is turned on in order to sense data on a corresponding bitline, and then turned off once the sensed data is latched at the sense amplifier output. The sense amplifier is turned on and off responsive to respective logic states of a sense amplifier enable signal. The turning on and turning off of the sense amplifier is also referred to as enabling and disabling the sense amplifier. The use of differential sense amplifiers generally provides faster sensing with lower dynamic power consumption than single-ended sensing arrangements.

However, controlling the timing of the transitions in the sense amplifier enable signal can be problematic, particularly for high-speed read operations. For example, in conventional arrangements, the sense amplifier enable signal may be provided by a sense latch, with the sense latch being set and reset in order to turn on and turn off the sense amplifiers. More particularly, the sense latch may be reset responsive to a pulse of a sense off signal that corresponds to a delayed and inverted version of the sense amplifier enable signal, as returned to the sense latch from a final one of the sense amplifiers. It can be very difficult to accurately control the delay of the sense off signal, particularly over PVT variations. As a result, read memory cycle time is increased, thereby degrading memory access time performance.

SUMMARY

Illustrative embodiments of the invention provide a memory device in which separate sense amplifier control signals are generated for respective sense amplifiers of the memory device. This allows more accurate control of the sense amplifier timing over PVT variations, thereby facilitating high-speed read operations.

In one embodiment, a memory device includes a memory array comprising a plurality of memory cells, a plurality of sense amplifiers configured to sense data stored in the memory cells of the memory array, and control circuitry configured to generate a plurality of separate sense amplifier control signals for application to respective control inputs of respective ones of the sense amplifiers. The separate sense amplifier control signals may comprise respective sense amplifier enable signals.

By way of example, the memory device may comprise a row of dummy memory cells each coupled to a dummy wordline. In such an arrangement, the control circuitry may comprise a plurality of logic gates coupled to respective ones of the dummy memory cells, with each such logic gate configured to generate a corresponding one of the separate sense amplifier control signals for a corresponding one of the sense amplifiers as a function of a data transition at a bitline of the corresponding dummy memory cell.

A given one of the logic gates may comprise a first input coupled to the bitline of the dummy memory cell, a second input adapted to receive a read mode signal, and an output coupled to the control input of the given sense amplifier. More particularly, the logic gate may comprise a NOR gate, with the read mode signal comprising a complementary read mode signal having a logic low level indicative of a read operation being performed and a logic high level indicative of a read operation not being performed.

The control circuitry may further comprise signal generation circuitry having an output coupled to the dummy wordline and providing a dummy wordline signal to the dummy wordline for controlling discharge of dummy bitlines associated with the dummy memory cells.

One or more of the illustrative embodiments can provide a memory device that exhibits shorter read memory cycles and lower power consumption, as well as improved overall operating performance, relative to conventional devices.

A memory device in accordance with embodiments of the invention may be implemented, for example, as a stand-alone memory device, such as a packaged integrated circuit, or as an embedded memory in a microprocessor or other processing device.

DETAILED DESCRIPTION

Embodiments of the invention will be illustrated herein in conjunction with exemplary semiconductor memory devices and associated control circuitry with separate sense amplifier control signal generation functionality. It should be understood, however, that embodiments of the invention are more generally applicable to any semiconductor memory device in which improvements in read performance are desired, and may be implemented using circuitry other than that specifically shown and described in conjunction with the illustrative embodiments.

Figure 1:
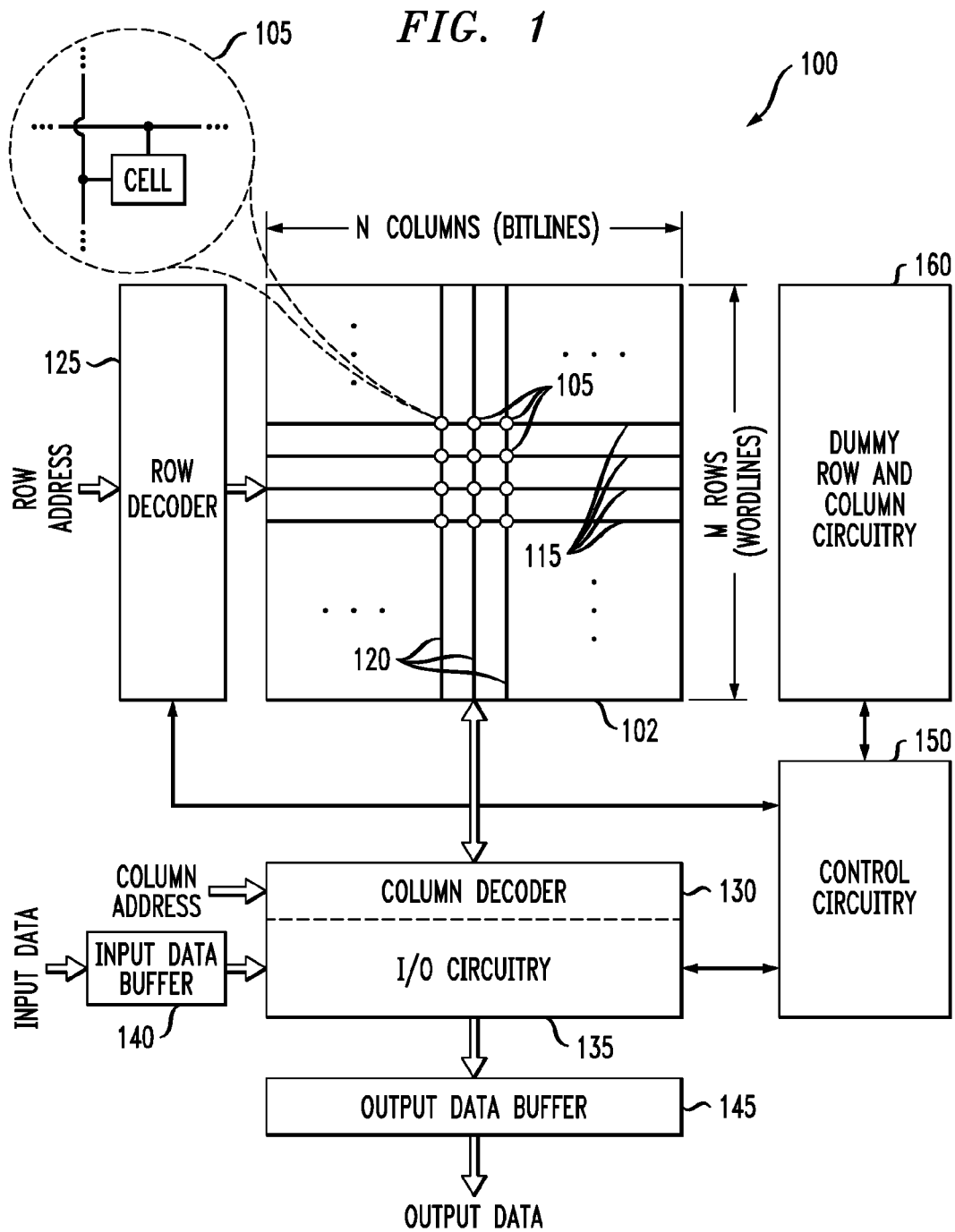
FIG. 1 is a block diagram of a semiconductor memory device comprising a memory array having a plurality of memory cells and incorporating control circuitry that generates separate control signals for respective sense amplifiers in an illustrative embodiment of the invention.

FIG. 1 shows a block diagram of a memory device 100 in accordance with an illustrative embodiment of the invention. The memory device 100 comprises a memory array 102. The memory array 102 comprises a plurality of memory cells 105 each configured to store a single bit of data. Such memory cells are also referred to herein as "bitcells." Each cell 105 is coupled to a corresponding row or wordline 115 and column or bitline 120. The memory array therefore includes a memory cell at each point where a wordline intersects with a bitline. The memory cells of the memory array are illustratively arranged in N columns and M rows. The values selected for N and M in a given implementation will generally depend upon on the data storage requirements of the application in which the memory device is utilized. In some embodiments, one of N and M may have value 1, resulting in an array comprising a single column or a single row of memory cells.

Particular ones of the memory cells 105 of the memory array 102 can be activated for writing data thereto or reading data therefrom by application of appropriate row and column addresses to respective row decoder 125 and column decoder 130. Other elements of the memory device 100 include input/output (I/O) circuitry 135, an input data buffer 140 and an output data buffer 145. The I/O circuitry 135 in the present embodiment is assumed by way of example to comprise a plurality of sense amplifiers, such as differential sense amplifiers coupled to respective columns of the memory array 102. The operation of these and other memory device elements, such as row decoder 125, column decoder 130, and buffers 140 and 145, is well understood in the art and will not be described in detail herein.

Although memory array 102 is identified in FIG. 1 as comprising the cells 105 and their associated wordlines and bitlines 115 and 120, the term "memory array" as used herein is intended to be more broadly construed, and may encompass one or more associated elements such as the row and column decoders 125 and 130, the I/O circuitry 135, or the input and output data buffers 140 and 145, or portions thereof.

Also, the wordlines 115 and bitlines 120, although shown as respective single lines in FIG. 1, may each comprise a corresponding pair of differential lines. By way of example, differential bitlines herein may be denoted as BL and BLB. Also, separate read and write wordlines or bitlines may be used, and a given such read or write wordline or bitline may comprise a corresponding pair of differential lines.

The memory device 100 in one or more of the illustrative embodiments may be assumed to comprise a static random access memory (SRAM) device. However, as indicated previously, the disclosed control circuitry with separate sense amplifier control signal generation functionality can be adapted in a straightforward manner for use with other types of memory devices, including, for example, dynamic random access memory (DRAM), electrically erasable programmable ROM (EEPROM), magnetic RAM (MRAM), ferroelectric RAM (FRAM), phase-change RAM (PC-RAM), etc. Also, other types of memory cell configurations may be used. For example, the memory cells 105 in the memory array 102 could be multi-level cells each configured to store more than one bit of data. Embodiments of the invention are therefore not limited in terms of the particular storage or access mechanism utilized in the memory device.

The present embodiment of memory device 100 is configured to avoid one or more of the drawbacks of conventional practice through the use of control circuitry 150 that is configured to generate a plurality of separate sense amplifier control signals for application to respective control inputs of respective sense amplifiers of the I/O circuitry 135. This allows more accurate control of the sense amplifiers over PVT variations, thereby facilitating high-speed read operations.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing embodiments of the invention.

Figure 2:
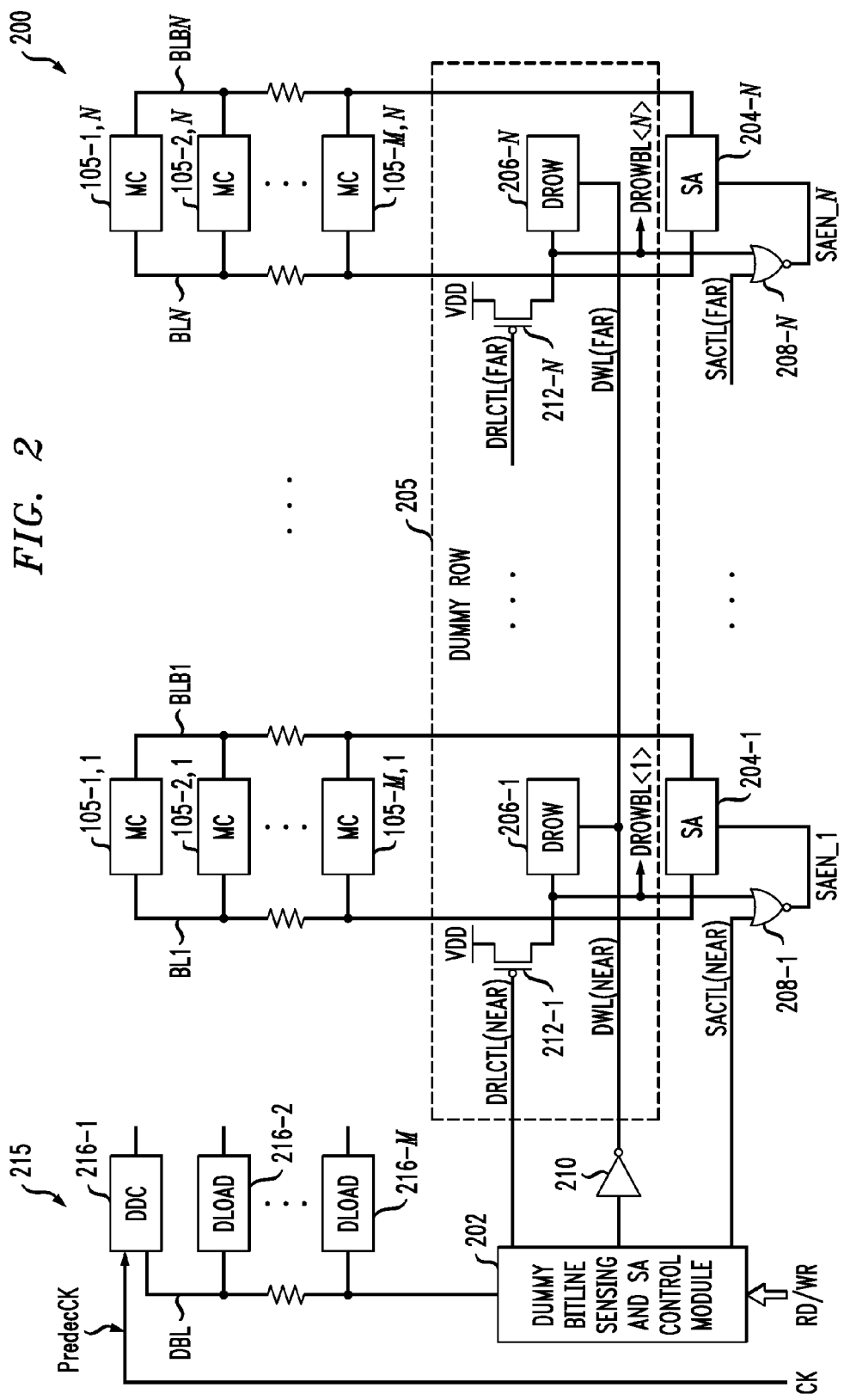
FIG. 2 shows a more detailed view of a portion of the FIG. 1 memory device in an illustrative embodiment.

Referring now to FIG. 2, a portion 200 of the FIG. 1 memory device 100 is shown. In this embodiment, the memory array 102 includes N pairs of read bitlines 120, with one such pair associated with each column of the memory array, and each pair comprising a read bitline BL and its complement BLB. As mentioned previously, the memory array comprises memory cells 105 arranged in M rows and N columns, from an initial memory cell 105-1,1 of the first column to a final memory cell 105-M,N of the last column.

The control circuitry 150 comprises a set of dummy bitline sensing and sense amplifier (SA) control module 202. The module 202 is coupled to a dummy bitline (DBL) and a dummy wordline (DWL), and operates at least in part responsive to applied read (RD) and write (WR) control signals.

The I/O circuitry 135 comprises a plurality of output sense amplifiers 204-1 through 204-N that are configured to sense stored data associated with respective columns of the memory array 102 in conjunction with read operations directed to the array. Each of the output sense amplifiers 204 is configured to sense data associated with a corresponding one of the read bitline pairs 120. Thus, for example, output sense amplifier 204-1 is coupled to the read bitline BL1 and its complement BLB1 of the first read bitline pair 120. Similarly, output sense amplifier 204-N is coupled to the read bitline BLN and its complement BLBN of the final read bitline pair 120. The output sense amplifiers 204 are therefore implemented as differential sense amplifiers in the present embodiment, although use of differential sense amplifiers should not be viewed as a requirement of embodiments of the invention.

The dummy row and column circuitry 160 in this embodiment more particularly comprises a dummy row 205 which includes a plurality of dummy memory cells 206-1 through 206-N, each also denoted as a DROW cell. Each of the dummy memory cells 206 in the dummy row 205 is coupled to the dummy wordline DWL. The dummy wordline DWL is further characterized in this embodiment as having a "near" portion in proximity to the first dummy memory cell 206-1 of the dummy row 205, and a "far" portion in proximity to the last dummy memory cell 206-N of the dummy row 205.

The control circuitry 150 in the present embodiment further comprises a plurality of logic gates 208 coupled to respective ones of the dummy memory cells 206 and each configured to generate a corresponding one of a plurality of separate sense amplifier control signals for a corresponding one of the sense amplifiers 204 as a function of a data transition at a bitline of the corresponding dummy memory cell 206. In this embodiment, the sense amplifier control signals more particularly comprise respective sense amplifier enable (SAEN) signals. Thus, for example, logic gate 208-1 generates a separate sense amplifier control signal SAEN_1 for application to a control input of the sense amplifier 204-1. Similarly, logic gate 208-N generates a separate sense amplifier control signal SAEN_N for application to a control input of the sense amplifier 204-N.

A given SAEN_i signal in the present embodiment, where i=1, 2, ... N, is assumed to transition from a logic "0" level to a logic "1" level in order to enable the corresponding sense amplifier 204-i, and to transition from its logic "1" level to its logic "0" level in order to disable the corresponding sense amplifier 204-i, although other types and configurations of signals may be used in other embodiments.

The logic gates 208 are implemented as respective NOR gates in the figure. Each NOR gate 208 has a first input coupled to the bitline of the corresponding dummy memory cell 206, a second input adapted to receive a read mode signal, and an output coupled to the control input of the corresponding sense amplifier 204. The read mode signal in the present embodiment comprises a common sense amplifier control (SACTL) signal that is applied to the second inputs of each of the NOR gates. Thus, NOR gate 208-1 has a first input coupled to the bitline of the corresponding dummy memory cell 206-1, a second input adapted to receive the SACTL signal, and an output coupled to the control input of the corresponding sense amplifier 204-1. The other NOR gates 208 are each configured in a similar manner.

As indicated above, the SACTL signal is a global signal applied to each of the NOR gates 208, and is an example of what is more generally referred to herein as a read mode signal, where a given read mode signal typically has a first logic level indicative of a read operation being performed and a second logic level indicative of a read operation not being performed.

Like the dummy wordline DWL, the signal line that carries the SACTL signal is further characterized in this embodiment as having a "near" portion in proximity to the first NOR gate 208-1, and a "far" portion in proximity to the last NOR gate 208-N.

In the FIG. 2 embodiment, transitions in the separate sense amplifier signals SAEN_i applied to the respective sense amplifiers 204-i are better matched to delays experienced by the DWL signal due to horizontal RC load. This provides improved operational margins over PVT variations.

The logic gates 208 may be viewed as an example of what is more generally referred to herein as "logic circuitry." Although illustratively shown as NOR gates in the figure, other embodiments of the invention can use different types of logic gates, or more generally logic circuitry, in providing the disclosed functionality for generation of separate sense amplifier control signals.

The module 202 may be viewed as comprising what is generally referred to herein as "signal generation circuitry." Such circuitry in the present embodiment has an output coupled to the dummy wordline DWL via inverter 210 and provides a dummy wordline signal to the dummy wordline DWL for controlling discharge of dummy bitlines associated with the dummy memory cells 206. This type of signal generation circuitry is utilized to provide the sense amplifier control functionality of the module 202. Of course, other types of signal generation circuitry may be used in this and other embodiments.

The inverter 210 is configured in the present embodiment to have a driving capability that is substantially the same as that of the wordline drivers used to drive the respective actual wordlines of the memory array.

Although not illustrated in the FIG. 2 embodiment, a dummy wordline return may be provided in the portion 200 in order to return the dummy wordline signal from the last dummy memory cell 206-N to a reset input of the module 202, with the dummy wordline signal being utilized to generate one or more reset signals used to control the timing of read or write operations in the memory 100.

Each of the dummy memory cells 206 of the dummy row 205 is associated with a corresponding P-channel MOS (PMOS) transistor 212 having a gate coupled to a dummy row control (DRLCTL) signal line. Like the dummy wordline DWL and the SACTL signal line, the DRLCTL signal line is characterized in the figure as having a "near" portion in proximity to the first dummy memory cell 206-1 of the dummy row 205, and a "far" portion in proximity to the last dummy memory cell 206-N of the dummy row 205. The PMOS transistors 212-1 through 212-N are used to controllably connect and disconnect the dummy row bitlines DROWBL<1> through DROWBL<N> from the VDD supply voltage, responsive to transitions in the logic level of the DRLCTL signal, as will be described in greater detail below in conjunction with FIGS. 3, 4 and 5. The dummy row bitlines DROWBL<1> through DROWBL<N> may also be referred to herein as localized dummy bitlines.

The dummy row and column circuitry 160 in this embodiment further comprises a dummy column 215 which includes a plurality of dummy memory cells 216. The dummy memory cells 216 more particularly comprise a dummy discharge cell 216-1, also denoted DDC, and dummy load cells 216-1 through 216-M, each also denoted as a DLOAD cell. Each of the dummy memory cells 216 in the dummy column 215 is coupled to the dummy bitline DBL. The module 202 may include additional signal generation circuitry configured to generate a read reset signal responsive to a signal transition on the dummy bitline DBL. This type of signal generation circuitry is utilized to provide the dummy bitline sensing functionality of the module 202.

The dummy discharge cell 216-1 receives a clock signal CK. The clock signal CK may be viewed as an example of an internal clock of the memory 100. Also associated with the clock signal CK in this embodiment is a predecoder clock signal PredecCK. The corresponding predecoder clock signal line is assumed to be loaded by a predecoder that is not explicitly shown in the figure, and to be triggered by the clock signal CK.

The clock signal CK also triggers dummy discharge cell 216-1 which is configured to discharge dummy bitline DBL. The discharge of DBL is detected in the dummy bitline sensing portion of module 202 and utilized to generate the DWL signal that is sent via inverter 210 to the dummy memory cells 206 of dummy row 205. The dummy memory cells 206, each of which is a replica of an actual memory cell 105, are arranged along the DWL signal line so as to ensure that the DWL signal experiences substantially the same horizontal RC loading conditions as an actual wordline signal.

Figure 3:
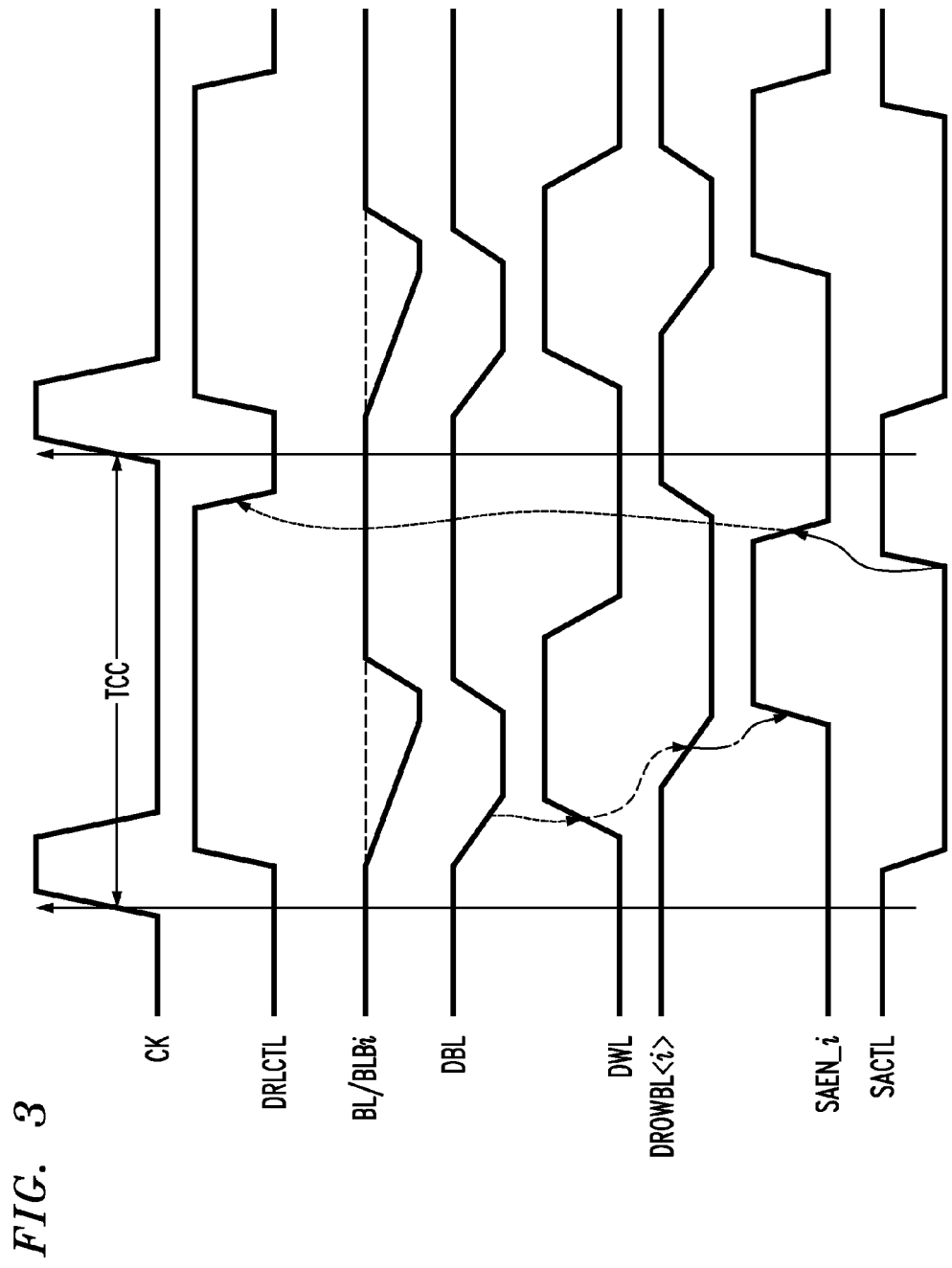
FIG. 3 is a timing diagram illustrating the operation of the FIG. 2 circuitry.

FIG. 3 shows the timing of various signals in the FIG. 2 embodiment over two cycles of the internal clock signal CK. The clock signal CK has a period denoted as TCC in the figure. The timing diagram shows the signals CK, DRLCTL, DBL, DWL and SACTL, as well as column-specific signals BL/BLB, DROWBL and SAEN associated with an ith column of the memory array 102, where, as indicated previously, the index i may take on values from 1 to N in this embodiment.

It is apparent from the FIG. 3 timing diagram that the given SAEN_i signal applied to a corresponding sense amplifier 204-i has a rising transition generated responsive to discharge of the corresponding DROWBL<i>, and a falling transition generated responsive to a rising transition of the SACTL signal.

Figure 4:
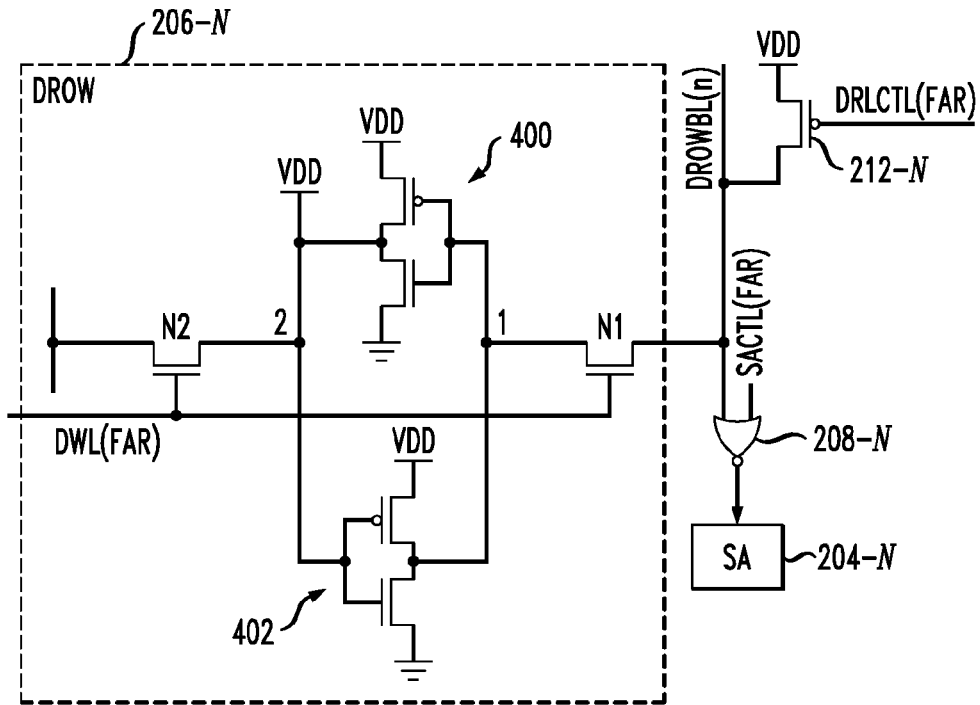
FIG. 4 shows a more detailed view of a portion of the FIG. 2 circuitry including a dummy memory cell and an associated sense amplifier.

Referring now to FIG. 4, far end dummy memory cell 206-N, as well as its associated sense amplifier and portions of its control circuitry, are shown in greater detail. The dummy memory cell 206-N has a structure similar to that of one of the actual memory cells 105 of the memory array, and comprises a pair of cross-coupled inverters 400 and 402. Each of first and second internal nodes of the dummy memory cell are connectable via N-type MOS (NMOS) transistors N1 and N2 to DROWBL<N> and a corresponding complementary dummy bitline, respectively, under control of the DWL signal.

As mentioned above, the bitline DROWBL<N> is an example of what may be referred to herein as a localized dummy bitline, as distinguished from the global dummy bitline DBL associated with dummy column 215.

The internal nodes of the dummy memory cell 206-N are denoted as nodes 1 and 2 in the figure. As indicated previously, node 1 is connectable via transistor N1 to DROWBL<N> under control of the DWL signal. Node 2 in the present embodiment is hard programmed to the upper supply voltage VDD as shown in the figure, and is therefore always at a logic "1" level. This ensures that node 1 will be at a logic "0" level. Thus, when DWL is asserted, DROWBL<N> will discharge to the logic "0" level.

The other dummy memory cells 206 are assumed to be configured in a manner similar to that shown for dummy memory cell 206-N in the figure.

During a given read cycle, the dummy memory cell 206-N discharges DROWBL<N> responsive to assertion of DWL. The NOR gate 208-N is controlled by DROWBL<N> and SACTL to generate the SAEN_N signal for application to sense amplifier 204-N. The PMOS transistor 212-N controllably connects DROWBL<N> to the upper supply voltage VDD responsive to the DRLCTL signal, in order to precharge DROWBL<N> at the end of the given read cycle.

Figure 5:
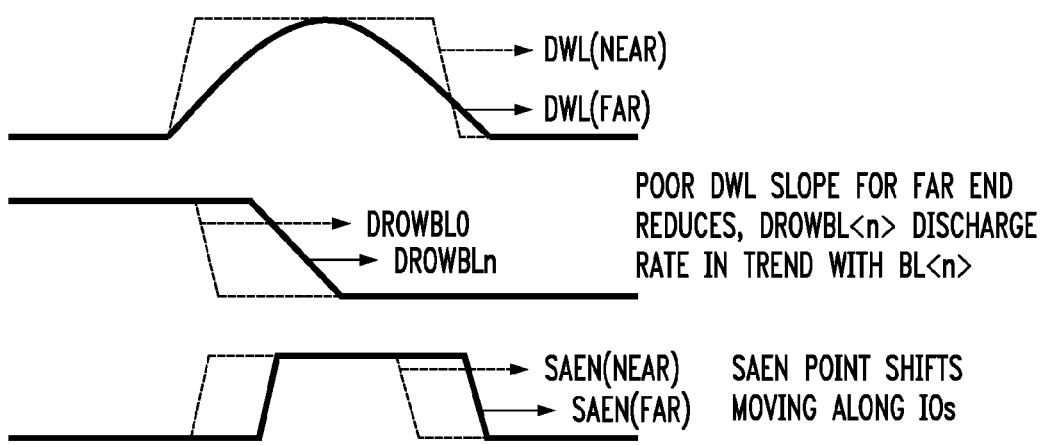
FIG. 5 is a timing diagram illustrating the operation of the FIG. 4 circuitry.

The relative timing and signal waveforms of each of the DWL, DROWBL and SAEN signals at the near and far ends of their respective signal lines are illustrated in FIG. 5. The near end signals are shown in dashed outline and the far end signals are shown in solid outline. Due to horizontal RC loading, the DWL signal at the far end of the DWL signal line shown in solid outline has poor or rounded slope transitions relative to the near end DWL signal shown in dashed outline. This tends to reduce the DROWBL<N> discharge rate relative to the DROWBL<0> discharge rate, as indicated in the figure, which tracks similar effects observed between BLN and BL0 for an actual wordline. Accordingly, the SAEN signals generated by the respective NOR gates 208 are shifted in time as indicated, from the near end to the far end, moving along the I/O circuitry comprising the sense amplifiers 204. More generally, these separate SAEN signals may be viewed as comprising respective enable pulses that are offset in time relative to one another, with the amount of offset increasing as a function of column index i, such that the enable pulse of the far end SAEN signal has the greatest offset relative to the corresponding enable pulse of the near end SAEN signal.

Such an arrangement avoids an undesirable early assertion of a given SAEN signal relative to its corresponding bitline discharge rate. This is particularly true in embodiments in which device speed increases disproportionately with bitline discharge rate, as devices move from a slower process corner to a faster process corner.

It also avoids a significant performance penalty that would otherwise be associated with configuring a common SAEN signal to control all of the sense amplifiers, since that common SAEN signal would have to accommodate the worst-case differential associated with the far end discharge rate.

As a result, the turn-on durations of the sense amplifiers 204 are more accurately controlled over PVT variations, in a manner that properly takes into account the horizontal RC loading of the actual wordlines. This reduces read cycle time and improves the overall operating performance of the memory device 100.

It is to be appreciated that the particular control circuitry configurations illustrated in FIGS. 2 and 4 are presented by way of illustrative example only, and other embodiments may use other types and arrangements of control circuitry. The term "control circuitry" as used herein is therefore intended to be broadly construed, and should not be viewed as being limited to the particular arrangements shown and described in conjunction with the illustrative embodiments.

For example, in one or more of these other embodiments, the conductivity types of at least a subset of the PMOS and NMOS transistors of the control circuitry may be reversed, and other suitable modifications may be made to the circuitry and associated signaling levels, as would be appreciated by one skilled in the art. Also, other types of sense amplifiers and other memory device components may be used in implementing other embodiments. The term "sense amplifier" as used herein is therefore intended to be broadly construed so as to encompass a wide variety of different arrangements of sensing circuitry.

Embodiments of the invention are particularly well suited for use in high-speed SRAMs and DRAMs, as well as other types of memories that demand high read speeds, such as content-addressable memories (CAMs) and processor register files.

A given memory device configured in accordance with an embodiment of the invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise, for example, an embedded memory implemented within a microprocessor, digital signal processor (DSP), application-specific integrated circuit (ASIC), field-programmable gate array (FPGA) or other type of processor or integrated circuit device.

Figure 6:
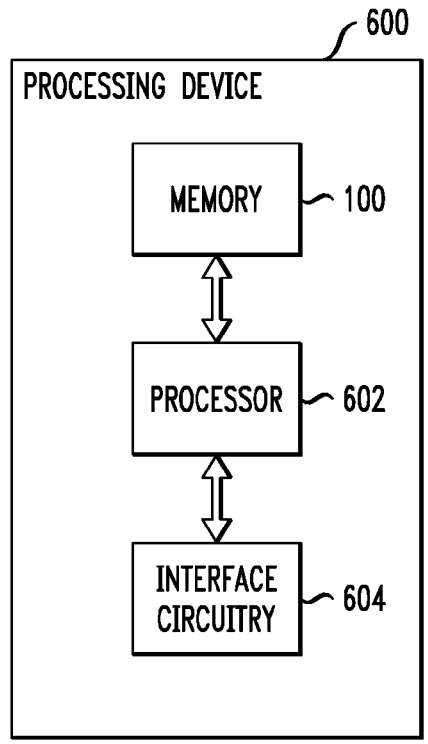
FIG. 6 is a block diagram of a processing device which incorporates the memory device of FIG. 1.

FIG. 6 shows an embodiment of a processing device 600 which incorporates the memory device 100 of FIG. 1. In this embodiment, the memory device 100 is coupled to a processor 602. The processing device further includes interface circuitry 604 coupled to the processor 602. The processing device 600 may comprise, for example, a computer, a server or a portable communication device such as a mobile telephone. The interface circuitry 604 may comprise one or more transceivers for allowing the device 600 to communicate over a network.

Figure 7:
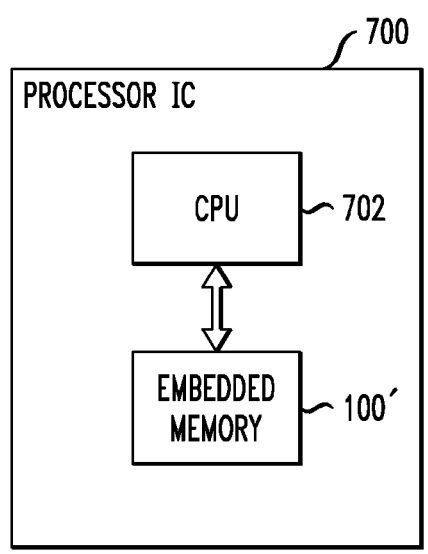
FIG. 7 is a block diagram of a processor integrated circuit which incorporates the memory device of FIG. 1 as an embedded memory.

Alternatively, processing device 600 may comprise a microprocessor, DSP or ASIC, with processor 602 corresponding to a central processing unit (CPU) and memory device 100 providing at least a portion of an embedded memory of the microprocessor, DSP or ASIC. FIG. 7 shows an example of an arrangement of this type, with processor integrated circuit 700 incorporating the memory device of FIG. 1 as an embedded memory 100'. The embedded memory 100' in this embodiment is coupled to a CPU 702. The embedded memory may comprise, for example, a high-speed register file. Numerous alternative embedded memory embodiments are possible.

As indicated above, embodiments of the invention may be implemented in the form of integrated circuits. In fabricating such integrated circuits, identical die are typically formed in a repeated pattern on a surface of a semiconductor wafer. Each die includes a memory device with a memory array, sense amplifiers and control circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the above-described embodiments of the invention are intended to be illustrative only. For example, other embodiments can use different types and arrangements of memory arrays, memory cell circuitry, sense amplifiers, control circuitry, transistor conductivity types, control signals, and other elements for implementing the described functionality. These and numerous other alternative embodiments within the scope of the following claims will be apparent to those skilled in the art.

What is claimed is:

1. A memory device comprising:
a memory array comprising a plurality of memory cells;
a plurality of sense amplifiers configured to sense data stored in the memory cells of the memory array; and
control circuitry configured to generate directly a plurality of separate and distinct sense amplifier control signals, wherein each of the plurality of separate and distinct sense amplifier control signals generated directly by the control circuitry is applied directly from the control circuitry to each respective control inputs of each respective ones of the plurality of sense amplifiers, wherein a first sense amplifier control signal is generated for a first sense amplifier and a second sense amplifier control signal is generated for a second sense amplifier, wherein the first and second sense amplifier control signals are generated by control circuit directly from a common sense amplifier control signal, wherein the first sense amplifier control signal is generated earlier than the second sense amplifier control signal, and wherein the first sense amplifier control receives a read mode enable pulse from the common sense amplifier control signal earlier than the second sense amplifier receives the read mode enable pulse from the common sense amplifier control signal.

2. The memory device of claim 1 wherein the control circuitry comprises for a given one of the sense amplifiers:
logic circuitry coupled to a corresponding dummy memory cell and configured to generate the separate sense amplifier control signal for the given sense amplifier as a function of a data transition at a bitline of the dummy memory cell, wherein, each of the separate sense amplifier control signals corresponds to a single given sense amplifier.

3. The memory device of claim 2 wherein the logic circuitry comprises a logic gate having a first input coupled to the bitline of the dummy memory cell, a second input adapted to receive a read mode signal, and an output coupled to the control input of the given sense amplifier.

4. The memory device of claim 3 wherein the logic gate comprises a NOR gate, and wherein the read mode signal comprises a global sense amplifier control signal having a first logic level indicative of a read operation being performed and a second logic level indicative of a read operation not being performed.

5. The memory device of claim 1 further comprising a row of dummy memory cells each coupled to a dummy wordline.

6. The memory device of claim 5 wherein the control circuitry comprises a plurality of logic gates coupled to respective ones of the dummy memory cells and each configured to generate a corresponding one of the separate sense amplifier control signals for a corresponding one of the sense amplifiers as a function of a data transition at a dummy bitline of the corresponding dummy memory cell.

7. The memory device of claim 5 wherein the control circuitry comprises
signal generation circuitry having an output coupled to the dummy wordline and providing a dummy wordline signal to the dummy wordline for controlling discharge of dummy bitlines associated with the dummy memory cells.

8. The memory device of claim 1 wherein the separate sense amplifier control signals comprise enable pulses that are offset in time relative to one another.

9. The memory device of claim 1 further comprising a column of dummy memory cells each coupled to a dummy bitline.

10. The memory device of claim 9 wherein the control circuitry comprises signal generation circuitry configured to generate a dummy wordline signal responsive to a signal transition on the dummy bitline.

11. The memory device of claim 1 wherein the separate sense amplifier control signals comprise respective sense amplifier enable signals.

12. The memory device of claim 11 wherein the given one of the sense amplifier enable signals applied to a corresponding sense amplifier has a rising transition generated responsive to discharge of a corresponding dummy bitline, and a falling transition generated responsive to a rising transition of a global sense amplifier control signal.

13. An integrated circuit comprising the memory device of claim 1.

14. A processing device comprising the memory device of claim 1.

15. The memory device of claim 1 further comprising a plurality of dummy memory cells corresponding to respective ones of the sense amplifiers and coupled to respective ones of a plurality of dummy bitlines, wherein the separate sense amplifier control signals are generated responsive to respective data transitions at respective ones of the dummy bitlines.

16. A method comprising:
by a control circuitry, generating directly a plurality of separate and distinct sense amplifier control signals, wherein a first sense amplifier control signal is generated for a first sense amplifier and a second sense amplifier control signal is generated for a second sense amplifier, wherein the first and second sense amplifier control signals are generated by the control circuit directly from a common sense amplifier control signal, wherein the first sense amplifier control signal is generated earlier than the second sense amplifier control signal, and wherein the first sense amplifier control signal receives a read mode enable pulse from the common sense amplifier control signal earlier than the second sense amplifier receives the read mode enable pulse from the common sense amplifier control signal; and
applying each of the separate and distinct sense amplifier control signals generated directly by the control circuitry to each respective control inputs of each single respective sense amplifiers of a memory device.

17. The method of claim 16 wherein the generating step comprises generating the separate sense amplifier control signal for a given one of the sense amplifiers as a function of a data transition at a bitline of a corresponding dummy memory cell coupled to a dummy wordline, wherein, each separate sense amplifier control signal corresponds to a given one of the sense amplifiers.

18. The method of claim 17 wherein the generating step comprises generating the separate sense amplifier control signal for the given sense amplifier as a function of the data transition at the bitline of the corresponding dummy memory cell and a logic state of a read mode signal.

19. The method of claim 16 further comprising the steps of:
providing a plurality of dummy memory cells each coupled to a dummy wordline; and
generating a dummy wordline signal for application to the dummy wordline for controlling discharge of dummy bitlines associated with the dummy memory cells.

20. The method of claim 16 further comprising the steps of:
providing a column of dummy memory cells each coupled to a dummy bitline; and generating a dummy wordline signal responsive to a signal transition on the dummy bitline.

21. An apparatus comprising:
control circuitry configured for coupling to a memory array comprising a plurality of memory cells;
the control circuitry being configured to generate a plurality of separate and distinct sense amplifier control signals each for application to respective control inputs of each respective sense amplifiers configured to sense data stored in the memory cells, wherein, each of the separate sense amplifier control signals corresponds to a single given sense amplifier, wherein a first sense amplifier control signal is generated for a first sense amplifier and a second sense amplifier control signal is generated for a second sense amplifier, wherein the first and second sense amplifier control signals are generated by the control circuit directly from a common sense amplifier control signal, wherein the first sense amplifier control signal is generated earlier than the second sense amplifier control signal, and wherein the first sense amplifier control signal receives a read mode enable pulse from the common sense amplifier control signal earlier than the second sense amplifier receives the read mode enable pulse from the common sense amplifier control signal.

* * * * *